(12) United States Patent
Higuchi et al.

(10) Patent No.: US 7,436,676 B2
(45) Date of Patent: Oct. 14, 2008

(54) PORTABLE ELECTRONIC APPARATUS AND BGA PACKAGE PROTECTIVE DEVICE

(75) Inventors: Toshihiro Higuchi, Tokyo (JP); Shotaro Nagaike, Kanagawa (JP); Taku Yamada, Kanagawa (JP); Yoji Inomata, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 217 days.

(21) Appl. No.: 10/489,498

(22) PCT Filed: Jun. 7, 2002

(86) PCT No.: PCT/JP02/05687

§ 371 (c)(1),
(2), (4) Date: Mar. 12, 2004

(87) PCT Pub. No.: WO03/026372

PCT Pub. Date: Mar. 27, 2003

(65) Prior Publication Data

US 2004/0235538 A1 Nov. 25, 2004

(30) Foreign Application Priority Data

Sep. 14, 2001 (JP) ............................ 2001-279871

(51) Int. Cl.
*H05K 5/00* (2006.01)
(52) U.S. Cl. .................... 361/752; 361/800; 361/790
(58) Field of Classification Search ............... 361/752, 361/790, 800, 816, 818, 797; 174/51, 35 R; 455/575
See application file for complete search history.

(56) References Cited

U.S. PATENT DOCUMENTS 4,890,199 A * 12/1989 Beutler ...................... 361/818

(Continued)

FOREIGN PATENT DOCUMENTS

EP 0833466 A2 4/1998

(Continued)

OTHER PUBLICATIONS

International Search Report dated Jun. 2, 2008.

*Primary Examiner*—Hung S Bui
(74) *Attorney, Agent, or Firm*—Pearne & Gordon LLP

(57) ABSTRACT

A portable electronic device in which microswitches (12) controlled by operation buttons (11) are mounted on one side of a printed circuit board (13), and circuit elements accommodated in BGA packages (14), (15) and (16) are soldered on the other side of the printed circuit board. In the portable electronic device, a shield wall (22) for surrounding the BGA packages (14), (15) and (16) is mounted on the printed circuit board (13), a first protrusion portion (18*b*) for holding down the shield wall (22) on the printed circuit board (13) is protruded from a case (18) of the portable electronic device (10), and second protrusion portion (18*c*) for holding down surfaces of the BGA packages (14); (15) and (16) on the printed circuit board (13) is protruded from the case (18) of the portable electronic device (10). With such a construction, the BGA packages are prevented from being peeled off from the printed circuit board (13). Further, even when the push buttons are frequently depressed in playing a game, the soldering parts of the BGA packages mounted on the back side of the operation button can be maintained in good conditions.

7 Claims, 5 Drawing Sheets

U.S. PATENT DOCUMENTS

| | | | | |
|---|---|---|---|---|
| 5,392,461 | A * | 2/1995 | Yokoyama | 455/90.2 |
| 5,596,487 | A * | 1/1997 | Castaneda et al. | 361/814 |
| 5,825,606 | A * | 10/1998 | Villain et al. | 361/220 |
| 6,031,732 | A * | 2/2000 | Koike et al. | 361/816 |
| 6,058,293 | A * | 5/2000 | Phillips | 455/575.1 |
| 6,063,999 | A * | 5/2000 | Kelly | 174/351 |
| 6,126,454 | A * | 10/2000 | Flegeo | 439/67 |
| 6,324,074 | B1 * | 11/2001 | Lunden | 361/816 |
| 6,333,459 | B1 | 12/2001 | Sato et al. | |
| 6,501,019 | B2 * | 12/2002 | Sato et al. | 174/377 |
| 6,570,776 | B2 * | 5/2003 | MacDonald et al. | 361/818 |
| 6,571,086 | B1 * | 5/2003 | Uusimaki | 455/90.3 |
| 6,763,245 | B1 * | 7/2004 | Satoh et al. | 455/550.1 |
| 6,817,093 | B2 * | 11/2004 | Kitade | 29/852 |
| 7,130,195 | B2 * | 10/2006 | Kawano et al. | 361/719 |

FOREIGN PATENT DOCUMENTS

| | | |
|---|---|---|
| EP | 1030496 | 8/2000 |
| JP | 63-102299 A | 5/1988 |
| JP | 6-2307 Y2 | 1/1994 |
| WO | 01-28305 A1 | 4/2001 |

* cited by examiner

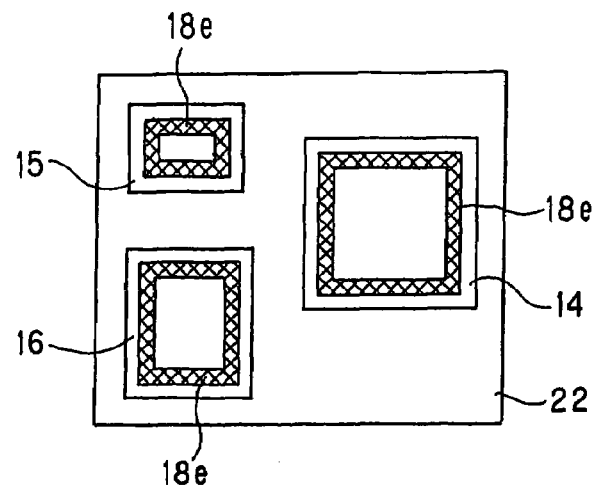
FIG. 6 (a)
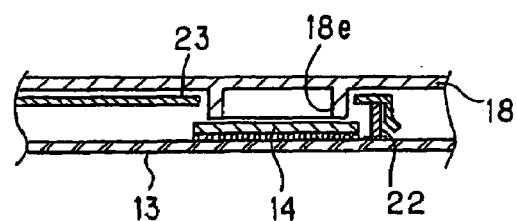
FIG. 6 (b)
FIG. 7
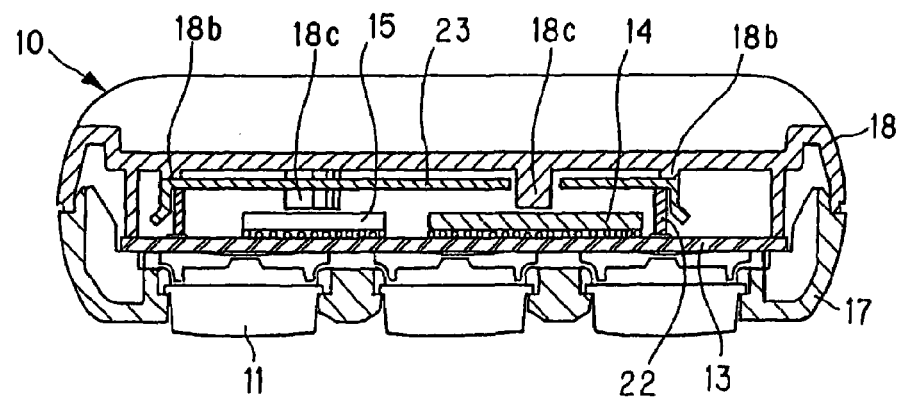

PORTABLE ELECTRONIC APPARATUS AND BGA PACKAGE PROTECTIVE DEVICE

TECHNICAL FIELD

The present invention relates to a protecting device for protecting BGAs (ball grid arrays), which are mounted on a portable electronic device, such as a portable telephone set (including a simple portable telephone set), a PDA (personal digital assistant), a portable game machine and the like. More particularly, the invention relates to a portable electronic device and a BGA package protecting device in which even if a pressing force to press down an operation button of the portable electronic device is applied to a printed circuit board onto which BGA packages are soldered, a soldering part of the BGA package is not peeled off.

BACKGROUND ART

FIG. 8 is a rear view showing a conventional portable telephone set, and FIG. 9 is a cross sectional view taken on line IX-IX in FIG. 8. An integrated circuit 5 is soldered to a back side of a printed circuit board 4 a front side of which has microswitches 3 mounted thereon, which are turned on and off by push buttons 2 of a portable telephone set 1. With an advance of a micro-fabrication technique, the integrated circuit 5 of a BGA package type has come to be widely used, recently. The integrated circuit 5 of the BGA package type is constructed such that a number of ball-like terminals are arrayed in a grid fashion on a bottom surface, and those ball-like terminals are soldered onto corresponding positions on the printed circuit board 4, respectively. Also for the printed circuit board 4 which is assembled into the small portable electronic device, the printed circuit board of the thin type used in recent years more and more increases its number.

When a telephone number is entered to the portable telephone set 1, the push buttons 2 are successively depressed to turn on the microswitches 3. At this time, a force of the finger pressing down each button is transmitted to the printed circuit board 4, so that the thin printed circuit board 4 is somewhat deformed. However, the soldering parts are not peeled off by such a force level as of the operation of entering the telephone number since the back side of the BGA package 5 is soldered onto the printed circuit board 4 over a broad area.

Recently, the portable telephone set of the type which allows the user to play a game during a queuing time of the telephone set increases its number, however. In playing the game, a navigation key for moving the cursor is in heavy usage. Through frequent and repeated button depressions, stress is accumulated in the soldering parts of the BGA package 5, which is soldered to the printed circuit board on the back side of the navigation key. As a result, peeling-off of the soldering part will highly possibly occur.

The soldering parts are located on the back side of the BGA package 5. Therefore, when the soldering part is peeled off, it is difficult to repair the peeled soldering part by re-soldering. Accordingly, the whole printed circuit board 4 must be replaced with a new one. This creates a problem of increasing the repairing cost. Such a low reliability of the soldering parts results in low reliability of the portable telephone set. The same problem arises in general portable electronic devices which each allow the user to play a game, as well as the portable telephone set.

DISCLOSURE OF THE INVENTION

Accordingly, an object of the present invention is to provide a portable electronic device and a BGA package protecting device in which even when the push buttons are frequently depressed, the soldering parts of the BGA packages mounted on the back side of the operation button can be maintained in good conditions.

According to a first aspect of the invention, there is provided a portable electronic device in which microswitches controlled by operation buttons are mounted on one side of a printed circuit board, and circuit elements accommodated in BGA packages are soldered on the other side of the printed circuit board, wherein a shield wall for surrounding the BGA packages is mounted on the printed circuit board, and a protrusion portion for holding down the shield wall on the printed circuit board is protruded from a case of the portable electronic device. With such a construction, even if the operation button is operated and a deformation force acts on the printed circuit, the printed circuit board is restricted from being deformed at least within an area surrounded by the shield wall.

According to a second aspect of the invention, there is provided a portable electronic device in which microswitches controlled by operation buttons are mounted on one side of a printed circuit board, and circuit elements accommodated in BGA packages are soldered on the other side of the printed circuit board, wherein protrusion portion for holding down surfaces of the BGA packages on the printed circuit board is protruded from the case of the portable electronic device. With such a construction, even if the operation button is operated and a deformation force acts on the printed circuit, the BGA packages are pressed by the printed circuit board, so that the soldering parts are maintained in good conditions.

According to a third aspect of the invention, there is provided a portable electronic device in which microswitches controlled by operation buttons are mounted on one side of a printed circuit board, and circuit elements accommodated in BGA packages are soldered on the other side of the printed circuit board, wherein a shield wall for surrounding the BGA packages is mounted on the printed circuit board, a first protrusion portion for holding down the shield wall on the printed circuit board is protruded from a case of the portable electronic device, and second protrusion portion for holding down surfaces of the BGA packages on the printed circuit board is protruded from the case of the portable electronic device. With such a construction, a protecting effect of protecting the soldering parts by the first protrusion portion and a protecting effect of protecting the soldering parts by the second protrusion portion synergistically act to thereby secure a further protection of the BGA packages.

According to a fourth aspect of the invention, there is provided a BGA package protecting device for protecting soldering parts of a BGA package soldered on a printed circuit board, wherein a shield wall for surrounding the BGA packages is mounted on the printed circuit board, and a member for holding down the shield wall on the printed circuit board along the shield wall is provided. With such a construction, even if a deformation force acts on the printed circuit, the printed circuit board is restricted from being deformed at least within an area surrounded by the shield wall. As a result, stress applied to the soldering parts of the BGA packages is lessened.

According to a fifth aspect of the invention, there is provided a BGA package protecting device for protecting soldering parts of a BGA package soldered on a printed circuit board, wherein a shield wall for surrounding the BGA packages is mounted on the printed circuit board, a case of the portable electronic device includes a first member for holding down the shield wall on the printed circuit board and second members for holding down surfaces of the BGA packages on the printed circuit board. With such a construction, a protecting effect of protecting the soldering parts by the first member and a protecting effect of protecting the soldering parts by the second member synergistically act to thereby secure a further protection of the BGA packages.

BRIEF DESCRIPTION OF THE DRAWINGS

FIG. 6(a) is a model diagram, when viewed from top, showing a BGA package portion of a portable telephone set according to a second modification of the second embodiment of the invention, and FIG. 6(b) a cross sectional view showing a key portion of the portable telephone set according to the second modification of the second embodiment of the invention.

FIG. 7 is a transverse cross sectional view showing a portable telephone set according to a third embodiment of the invention.

Figure 1:
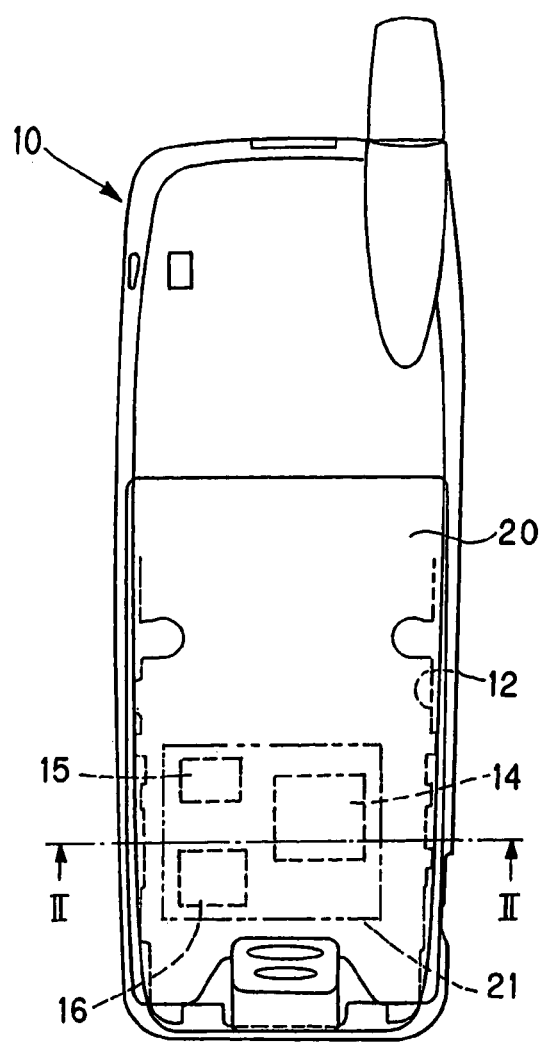
FIG. 1 is a rear view showing a portable telephone set according to a first embodiment of the present invention.

In the figure, reference numeral 10 is a portable telephone set 10; 11 is a push button; 12 is a microswitch; 13 is a printed circuit board; 14, 15 and 16 are BGA packages; 17 is a front case; 18 is a rear case; 18b is a protrusion portion for holding down a shield wall; 18c, 18d and 18e are bosses (projections); 21 is a shield plate; 22 is a shield wall; and 23 is a shield cover.

BEST MODE FOR CARRYING OUT THE INVENTION

Embodiments of the present invention will be described with reference to the accompanying drawings.

Figure 2:
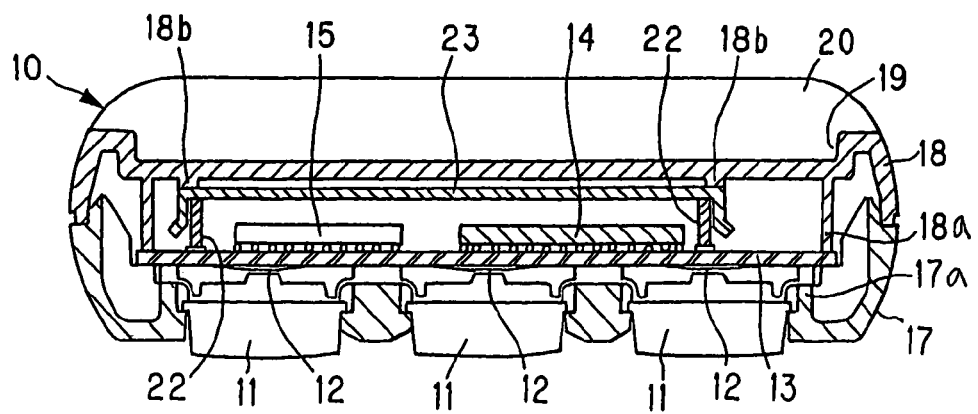
FIG. 2 is a transverse cross sectional view showing the portable telephone set according to the first embodiment of the invention.

FIG. 1 is a rear view showing a portable telephone set according to a first embodiment of the present invention. FIG. 2 is a cross sectional view taken on line II-II in FIG. 1. In a portable telephone set 10 constructed according to the present invention, BGA packages 14, 15 and 16 are soldered to a back side of a printed circuit board 13 which has microswitches 12 mounted on the front side thereof, which are each turned on when a push button 11 associated therewith is depressed and turned off when the user's finger is detached from the button.

An outer peripheral part of the printed circuit board 13 is held between a rib 17a protruded from a front case 17 of the portable telephone set 10 and a rib 18a protruded from a rear case 18 of the portable telephone set 10. A battery housing portion 19 is formed in the back side of the rear case 18, and covered with a back cover 20.

The portable telephone set 10 of the embodiment is arranged such that the integrated circuits including those of the BGA package, which are mounted on a printed circuit board 13, are soldered collectively to one location and their are covered with a shield plate 21.

The shield plate 21 is formed with a stainless plate, for example. The shield plate includes a shield wall 22 for surrounding collectively the BGA packages 14, 15 and 16 standing upright on the printed circuit board 13 and a shield cover 23 which is fit to an outer peripheral end of the shield wall 22, and covers an upper surface opening part surroundingly defined by the shield wall 22. The lower end of the shield wall 22 is fixed to the printed circuit board 13 by soldering or another suitable fixing means, and heat radiation holes are formed at proper positions of the shield cover 23.

Thus, the shield wall 22 for surrounding the BGA packages 14, 15 and 16 is provided in the embodiment. Even when a force of depressing the push button 11 is applied to the printed circuit board 13, the depressing force is weak and fails to deform the shield wall 22 in a direction horizontal to the wall surface of the shield wall 22 and hence fails to give stress to the soldering parts of the BGA packages 14, 15 and 16. Thus, the shield wall 22 functions as a protecting device for the BGA packages 14, 15 and 16.

The instant embodiment further includes a BGA package protecting device for restricting a deformation of the printed circuit board 13, in addition to the shield wall 22. The BGA package protecting device is formed with a rib-like protrusion portion 18b protruded from the rear case 18 of the portable telephone set 10, and the protrusion portion 18b holds down the shield cover 23 on the shield wall 22. The protrusion portion 18b may be formed continuously or discretely over the entire circumference of the shield wall 22.

Use of such a structure that the shield wall 22 is pressed down with the rear case 18 further restricts a deformation of the printed circuit board 13 surrounded by and within the shield wall 22. And, much less stress is imparted to the soldering parts of the BGA packages 14, 15 and 16, which are surrounded by and located within the shield wall 22. Therefore, even when the push buttons 11 are frequently depressed in playing a game, there is less chance that the BGA packages 14, 15 and 16 are peeled off, and a reliability of the portable telephone set is further enhanced.

Figure 3:
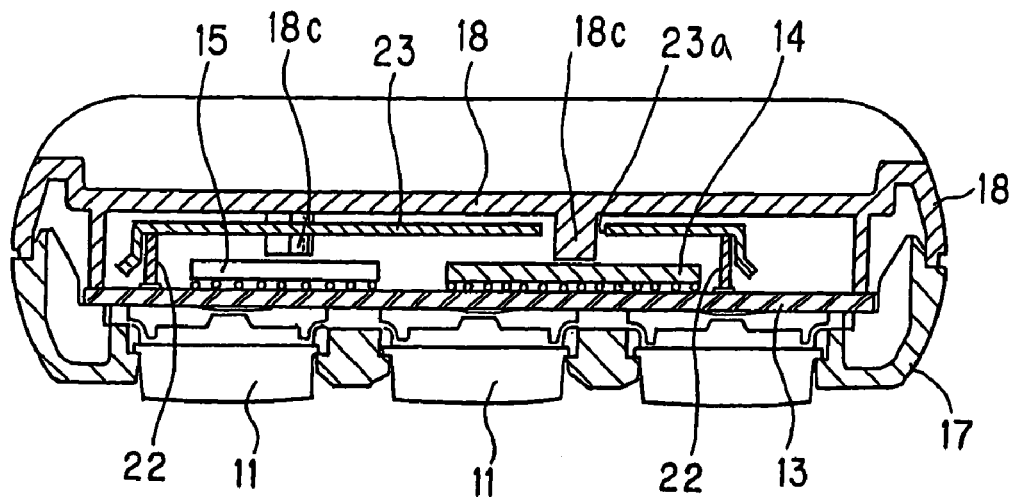
FIG. 3 is a transverse cross sectional view showing a portable telephone set according to a second embodiment of the invention.
Figure 4:
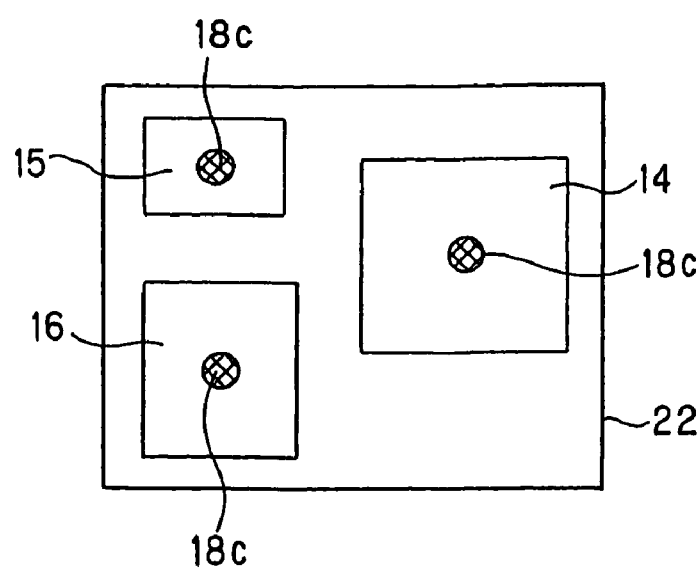
FIG. 4 is a model diagram, when viewed from top, showing a BGA package potion of the portable telephone set according to the second embodiment of the invention.
Figure 5:
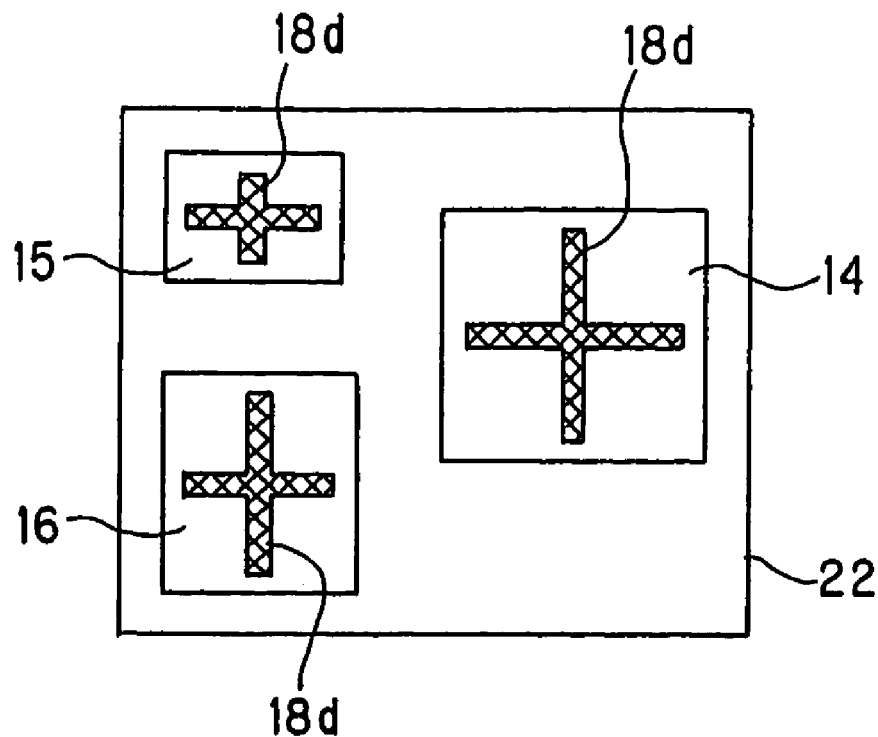
FIG. 5(a) is a model diagram, when viewed from top, showing a BGA package portion of a portable telephone set according to a first modification of the second embodiment of the invention.
FIG. 5(b) is a cross sectional view showing a key portion of the portable telephone set according to the first modification of the second embodiment of the invention.
Figure 5:
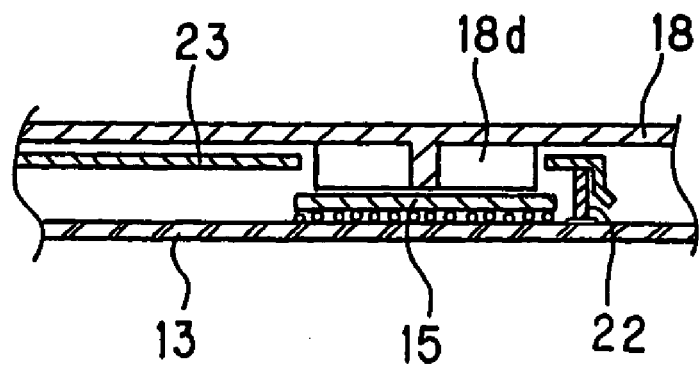
Figure 8:
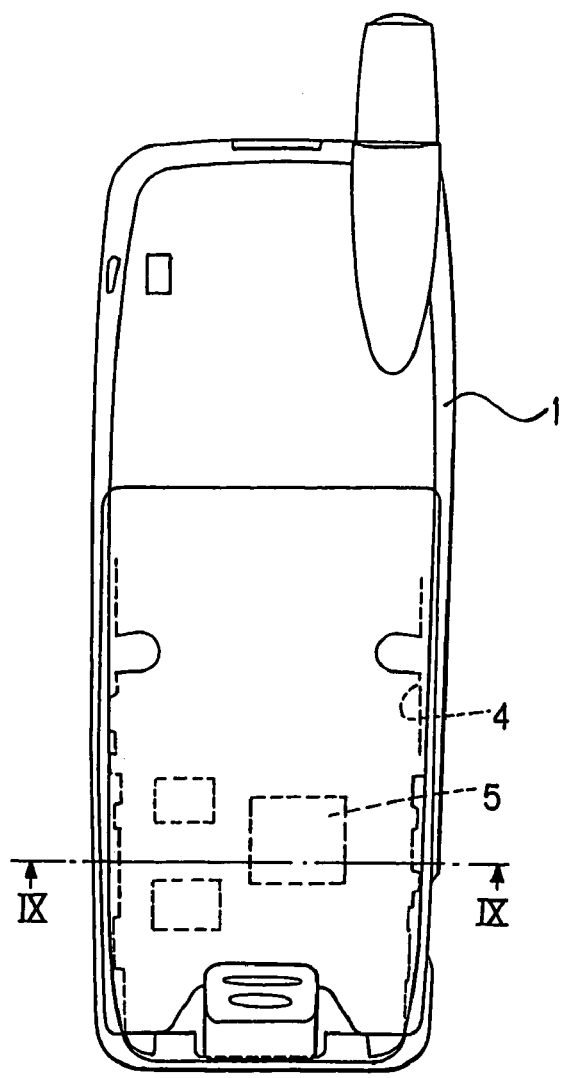
FIG. 8 is a rear view showing a conventional portable telephone set.
Figure 9:
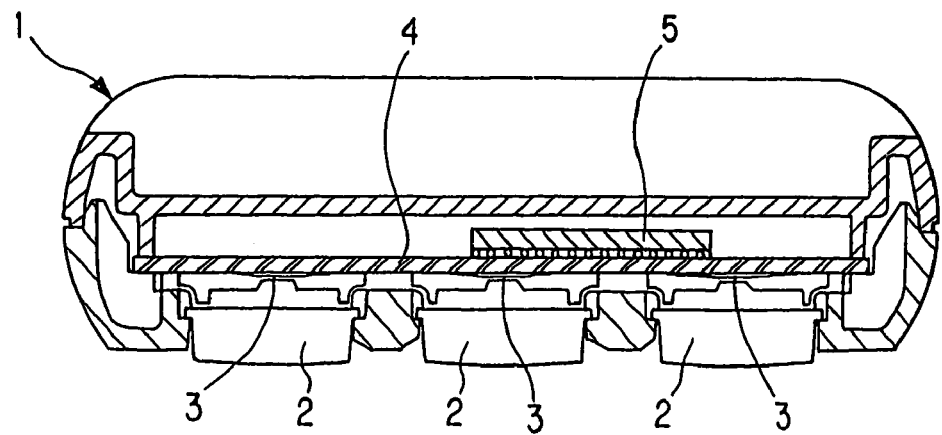
FIG. 9 is a transverse cross sectional view showing the conventional portable telephone set.

FIG. 3 is a cross sectional view showing a portable telephone set according to a second embodiment of the invention. The second embodiment employs protecting bosses (protrusion portion) 18c protruded from the rear case 18 instead of the protecting boss 18b of the rear case 18, which is employed in the first embodiment shown in FIG. 2, and those protecting bosses press down the BGA packages 14, 15 and 16 against the printed circuit board 13. FIG. 4 show the shape and positions of the protecting bosses 18c when the bosses press down the surfaces of the BGA packages 14, 15 and 16.

Boss insertion holes 23a are formed at positions of the shield cover 23, which correspond respectively to the central parts of the BGA packages 14, 15 and 16. The protecting bosses 18c extend from the rear case 18, pass through the boss insertion holes 23a and reach the surfaces of the BGA packages 14, 15 and 16. Preferably, the tip of each of the protecting bosses 18c is brought into close contact with the surface of each of the BGA packages 14, 15 and 16. Actually, however, a slight gap is present between them as shown in FIG. 3 since production tolerances of the related component parts are present.

Even when the gap is present, the gap is small, about 0.1 mm. Therefore, even if the printed circuit board 13 is deformed a distance close in value to the soldering part by the depressing force to the push button 11, the peeling-off of the soldering part does not occur. The rear case 18 restricts a further deformation of the printed circuit board 13 which exceeds the gap. Consequently, the soldering part can be maintained in good conditions with lapse of time.

FIGS. 5(a) and 5(b) and FIGS. 6(a) and 6(b) are explanatory diagrams for explaining embodiments of the invention in which shapes of the protecting bosses are each changed from that of the already described one. The protecting bosses hold down the BGA packages at wider areas, so that the holding effect of the BGA packages is increased. The size increase of the protecting bosses possibly hinders heat radiation of the BGA packages, and increases material cost and the weight of the portable telephone set.

To cop with this, in the embodiment shown in FIGS. 5(a) and 5(b), the surfaces of the BGA packages 14, 15 and 16 are held down with protecting bosses 18d each shaped like a cross. In the embodiment shown in FIGS. 6(a) and 6(b), the surfaces of the BGA packages 14, 15 and 16 are held down with protecting bosses 18e each shaped like a rectangle. Since the protecting bosses are cross or rectangle shaped, the protecting bosses do not hinder the heat radiation of the BGA packages.

FIG. 7 is a cross sectional view showing a portable telephone set according to a third embodiment of the invention. The instant embodiment is featured substantially by a combination of the feature of the first embodiment (the protrusion portion 18b formed along the shield wall 22 shown in FIG. 2) and the feature of the second embodiment (the protecting bosses 18c shown in FIG. 3). It is evident that the protecting bosses 18d and 18e shown in FIGS. 5 and 6 may be used for the protecting bosses.

Since the third embodiment has both the features of the first and second embodiments, those features synergistically act to more lessen the stress applied to the soldering parts of the BGA packages 14, 15 and 16. Therefore, even when the push button 11 is repeatedly and frequently depressed, the soldering parts can be maintained in good conditions for a long period of time.

While the invention has been described in detail and using specific embodiments, it will be apparent to those skilled in the art that various changes, alteration, modification and variations may be made without departing from the spirit and scope of the invention.

This application is based on Japanese Patent Application No. 2001-279871, filed Sep. 14, 2001, the contents of which are incorporated herein by reference.

INDUSTRIAL APPLICABILITY

As seen from the foregoing description, in the invention, even when the operation buttons are frequently operated, the soldering parts of the BGA packages mounted on the back side of the operation button can be maintained in good conditions. As a result, a reliability of the portable electronic device is improved.

The invention claimed is:

1. A portable electronic device in which microswitches controlled by operation buttons are mounted on one side of a printed circuit board, and an electronic component containing a circuit element is soldered on the other side of the printed circuit board, the portable electronic device is characterized in that:
   the electronic component and the microswitches face to each other across the printed circuit board,
   a shield wall for surrounding the electronic components is mounted on the printed circuit board,
   a shield cover covers an upper surface of the shield wall, and
   a protrusion portion for holding down the shield wall on the printed circuit board is protruded from a case of the portable electronic device.

2. The portable electronic device according to claim 1, wherein the printed circuit board is restricted from being deformed within an area surrounded by the shield wall.

3. A portable electronic device in which microswitches controlled by operation buttons are mounted on one side of a printed circuit board, and an electronic component containing a circuit element is soldered on the other side of the printed circuit board, the portable electronic device is characterized in that:
   a shield wall for surrounding the electronic components is mounted on the printed circuit board;
   a first protrusion portion for holding down the shield wall on the printed circuit board is protruded from a case of the portable electronic device; and
   a second protrusion portion for holding down a surface of the electronic components on the printed circuit board is protruded from the case of the portable electronic device.

4. An electronic component protecting device for protecting soldering parts of an electronic component soldered on a printed circuit board, the electronic component protecting device is characterized in that:
   a shield wall for surrounding the electronic components is mounted on the printed circuit board; and
   a case of the portable electronic device includes a first member for holding down the shield wall on the printed circuit board and second members for holding down a surface of the electronic components on the printed circuit board.

5. The electronic component protecting device according to claim 4, wherein the printed circuit board is restricted from being deformed within an area surrounded by the shield wall.

6. A portable electronic device in which microswitches controlled by operation buttons are mounted on one side of a printed circuit board, and an electronic component containing a circuit element is soldered on the other side of the printed circuit board, the portable electronic device is characterized in that:
   a protrusion portion for holding down a surface of the electronic components on said printed circuit board is protruded from a case of the portable electronic device;
   the electronic component and the microswitches face to each other across the printed circuit board; and
   a shield member for surrounding the electronic component is mounted on the printed circuit board, the shield member having an insertion hole,
   wherein the protrusion portion passes through the insertion hole of the shield member and reaches the surface of the electronic component.

7. An electronic component protecting device for protecting soldering parts of an electronic component soldered on a printed circuit board, the electronic component protecting device, comprising:
   a shield member for surrounding the electronic component is mounted on the printed circuit board, and the shield member having an insertion hole; and
   a protrusion portion for holding down a surface of the electronic component on the printed circuit board is protruded from a case of the portable electronic device,
   wherein the protrusion portion passes through the insertion hole of the shield member and reaches the surface of the electronic component.

* * * * *